(12) United States Patent
Fu et al.

(10) Patent No.: US 11,651,982 B2
(45) Date of Patent: May 16, 2023

(54) DRYING BLOCK STRUCTURE AND STORAGE DEVICE

(71) Applicant: Winbond Electronics Corp., Taichung (TW)

(72) Inventors: Cheng-Gang Fu, Taichung (TW); Bo-Ren Chi, Taichung (TW); Tze-Ching Chuang, Taipei (TW); Te-Wei Chu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 599 days.

(21) Appl. No.: 16/599,478

(22) Filed: Oct. 11, 2019

(65) Prior Publication Data

US 2021/0111047 A1 Apr. 15, 2021

(51) Int. Cl.
*H01L 21/673* (2006.01)
*B01J 35/04* (2006.01)
(Continued)

(52) U.S. Cl.
CPC ...... *H01L 21/67366* (2013.01); *B01D 53/261* (2013.01); *B01J 20/28045* (2013.01);
(Continued)

(58) Field of Classification Search
CPC .............. H01L 21/677; H01L 21/6773; H01L 21/67703; H01L 21/67393; H01L 21/67294; H01L 21/67295; H01L 21/6726; H01L 21/672; H01L 2223/54493; H01L 21/02021; H01L 2924/15151; H01L 21/6732; H01L 21/67383; H01L 21/68707; H01L 23/544; H01L 21/68735; H01L 23/32; H01L 2924/15153; G01S 19/35; B25J 15/0014; B25J 11/0095; Y10T 428/21; Y10T 428/24165; B65G 49/061; G05B 2219/32179; G01L 5/008; B32B 7/00; B01J 20/2804; B01J 20/28045; B01J 20/28035; B01D 53/26; B01D 53/265;
(Continued)

(56) References Cited

U.S. PATENT DOCUMENTS 5,346,518 A * 9/1994 Baseman .......... H01L 21/67393
55/385.6
2003/0115956 A1* 6/2003 Moehnke .......... H01L 21/67253
73/866.5
(Continued)

FOREIGN PATENT DOCUMENTS

CN 2385788 Y 7/2000
CN 201658938 U 12/2010
(Continued)

OTHER PUBLICATIONS

Office Action dated Apr. 13, 2020 in TW Application No. 108127991.

*Primary Examiner* — Alia Sabur
(74) *Attorney, Agent, or Firm* — Muncy, Geissler, Olds & Lowe, P.C.

(57) ABSTRACT

A drying block structure is provided, including a main body and a protective layer. The main body has a honeycomb and substantially circular shape. The protective layer covers the main body and has a porous structure. The main body and the protective layer are integrally formed as one piece.

13 Claims, 10 Drawing Sheets

(51) Int. Cl.
    *H01L 21/677*     (2006.01)
    *B01J 20/28*     (2006.01)
    *B01D 53/26*     (2006.01)

(52) U.S. Cl.
    CPC ........ *B01J 35/04* (2013.01); *H01L 21/67393* (2013.01); *H01L 21/67769* (2013.01); *B01D 2253/3425* (2013.01)

(58) Field of Classification Search
    CPC .... B01D 2253/30–3425; B01D 53/261; G03F 7/7085
    See application file for complete search history.

(56) References Cited

U.S. PATENT DOCUMENTS

| | | | | |
|---|---|---|---|---|
| 2006/0105158 | A1* | 5/2006 | Fritz | B01D 53/02 428/317.9 |
| 2016/0204012 | A1* | 7/2016 | Bores | H01L 21/67366 206/204 |
| 2020/0152494 | A1* | 5/2020 | Schuda | H01L 21/67276 |

FOREIGN PATENT DOCUMENTS

| | | |
|---|---|---|
| CN | 201796874 U | 4/2011 |
| CN | 109499276 A | 3/2019 |
| JP | H-09150056 A | 6/1997 |
| JP | 2017015328 A | 1/2017 |
| TW | 390855 B | 5/2000 |
| TW | I-511774 B | 12/2015 |
| TW | M-539495 U | 4/2017 |

* cited by examiner

DRYING BLOCK STRUCTURE AND STORAGE DEVICE

BACKGROUND OF THE INVENTION

Field of the Invention

The present disclosure relates to a drying block structure.

Description of the Related Art

In semiconductor industry, a manufactured wafer is usually stored in a front opening shipping box (FOSB) before being processed further. However, a chemical reaction may occur between the contacts on the wafer and fluorine ion residue generated from wafer processes, creating corrosion. Water is a catalyst for bonding pad corrosion (RMA) on the wafer. As a result, moisture in the FOSB should be controlled during wafer packaging and storing.

Conventional methods used in the industry to avoid corrosion include reducing the amount of fluorine residue in the FOSB by optimizing the manufacturing process, or by controlling the moisture in the FOSB by use of a drier. An additional bagging may be provided outside the FOSB to cover the FOSB, and a drier may be provided between the FOSB and the bagging for absorbing moisture. In general, the drier may be disposed outside the FOSB, affixed by tape using an automatic packing machine as well.

However, a conventional drier is disposed outside the FOSB rather than inside the FOSB, so the moisture inside the FOSB cannot be absorbed as expected. Furthermore, the drier cannot be directly disposed in the FOSB because of the structural limitations of current driers.

BRIEF SUMMARY OF THE INVENTION

A drying block structure is provided, including a main body having a honeycomb structure and being circular, and a protective layer covering the main body and having a porous structure, wherein the protective layer is formed integrally with the main body.

In some embodiments of the present disclosure, the main body includes a straight side, an arc-shaped side, and a recess, wherein the recess extends from the center of the main body to the straight side. The width of the recess is less than the length of the straight side in an extension of the straight side. The depth of the recess is less than the thickness of the main body in the direction perpendicular to the extension direction of the straight side. In some embodiments, the drying block structure further includes a plate-shaped element and a positioning element. The plate-shaped element is disposed in the recess, and the positioning element is disposed on the plate-shaped element. The material of the main body includes porous material, and the material of the plate-shaped element includes semiconductor material. In some embodiments, the length of the recess is shorter than the radius of the main body.

The present disclosure also provides a storage device for storing a wafer, including a case and a drying block structure. A plurality of recesses are positioned in the case, wherein the wafer is disposed in one of the recesses, the drying block structure is disposed in another one of the recesses, and the diameter of the drying block structure is substantially identical to the diameter of the wafer.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION OF THE INVENTION

The following disclosure provides many different embodiments, or examples, for implementing different features of the subject matter provided. These are, of course, merely examples and are not intended to be limiting.

Figure 1:
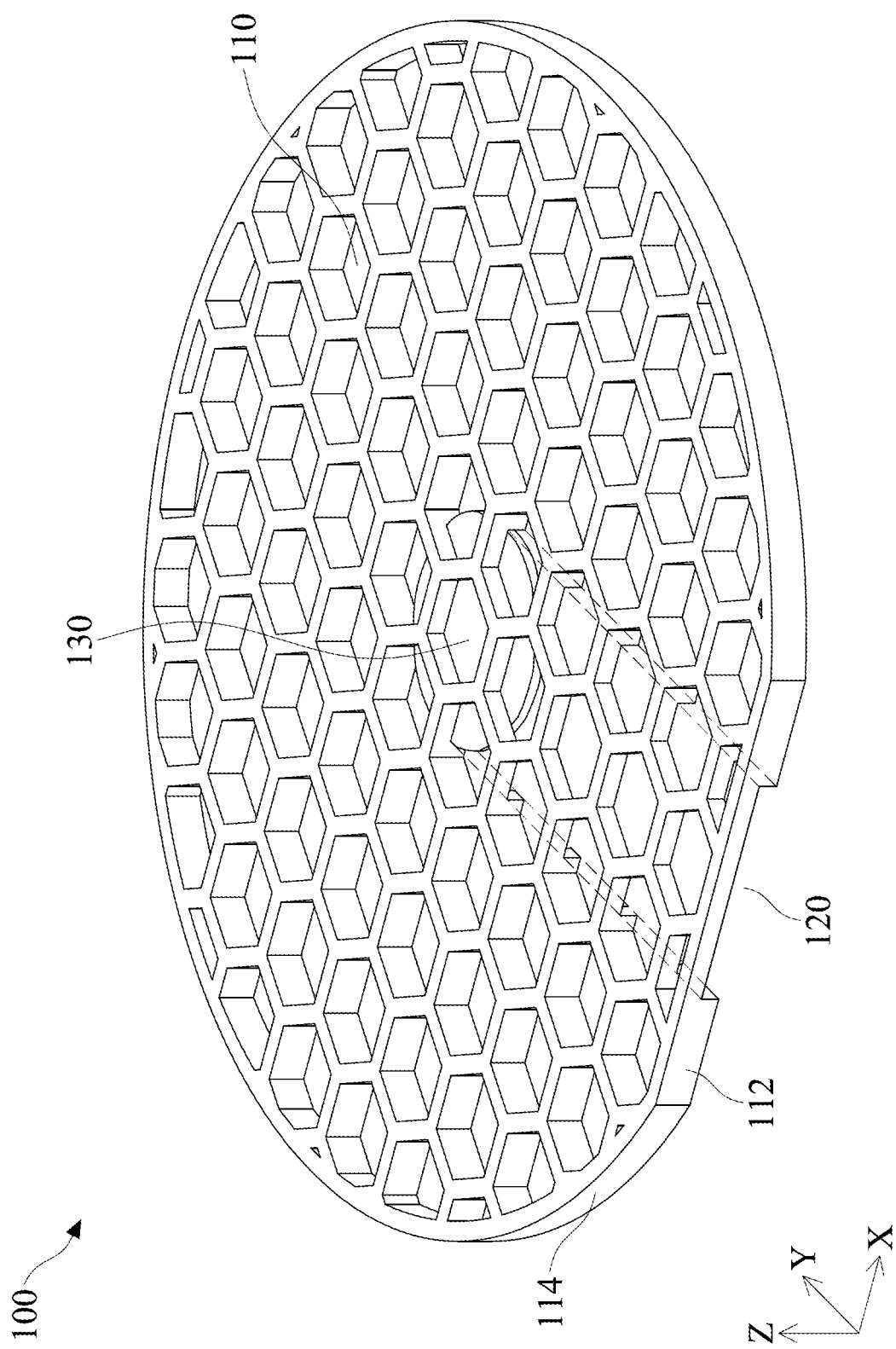
FIG. 1 is a perspective view of a drying block structure in some embodiments of the present disclosure.
Figure 2:
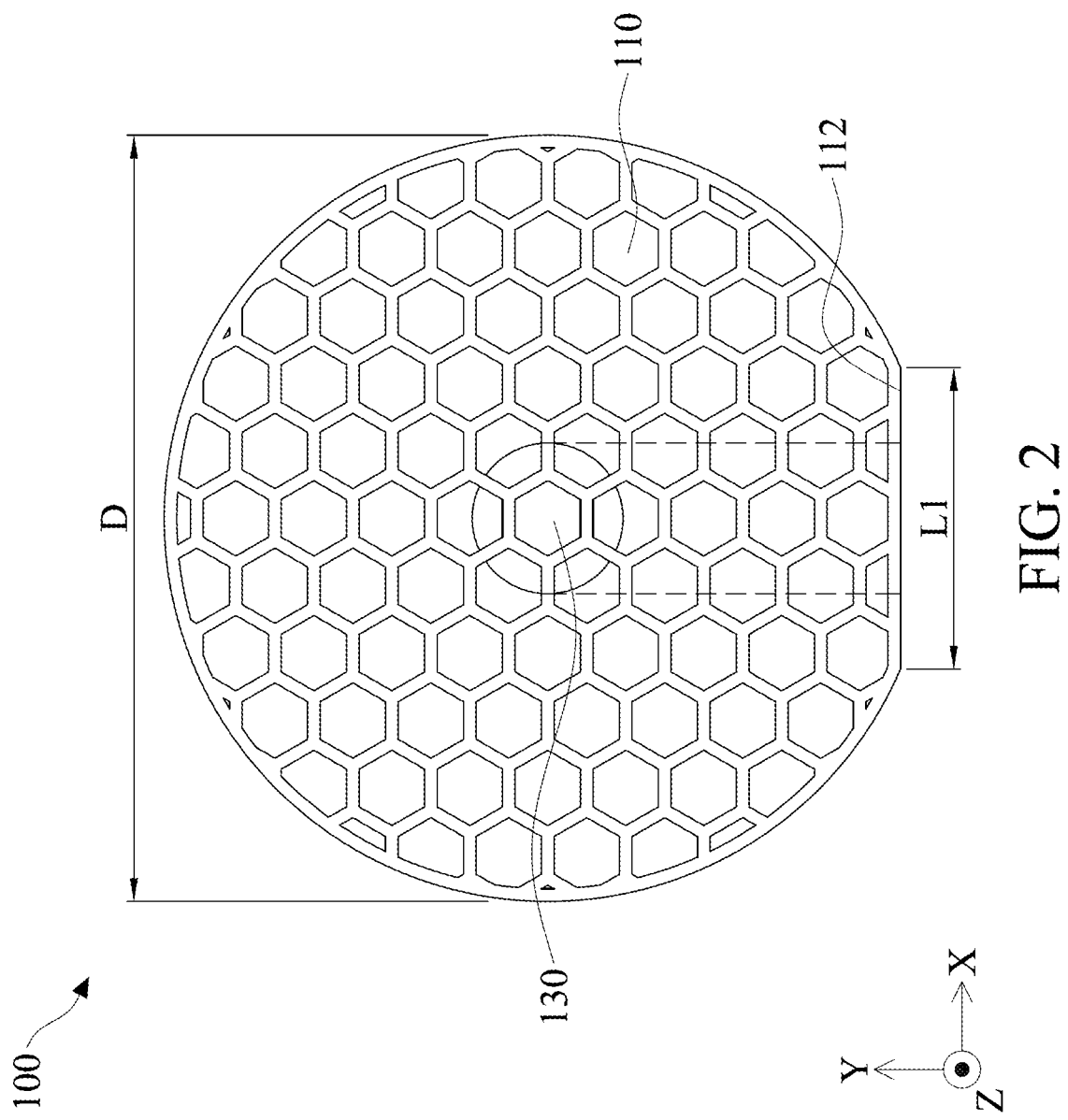
FIG. 2 is a top view of a drying block structure in some embodiments of the present disclosure.

In FIG. 1, a main body 110 of a drying block structure 100 has a honeycomb structure, and a recess 120 is formed at one side of the main body 110 (shown as dashed lines). In FIGS. 2 to 7, the diameter of the drying block structure 100 is D, and a straight side 112 and an arc-shaped side 114 are formed at the periphery of the main body 110. Furthermore, a plate-shaped element 130 may be disposed in the recess 120.

Figure 3:
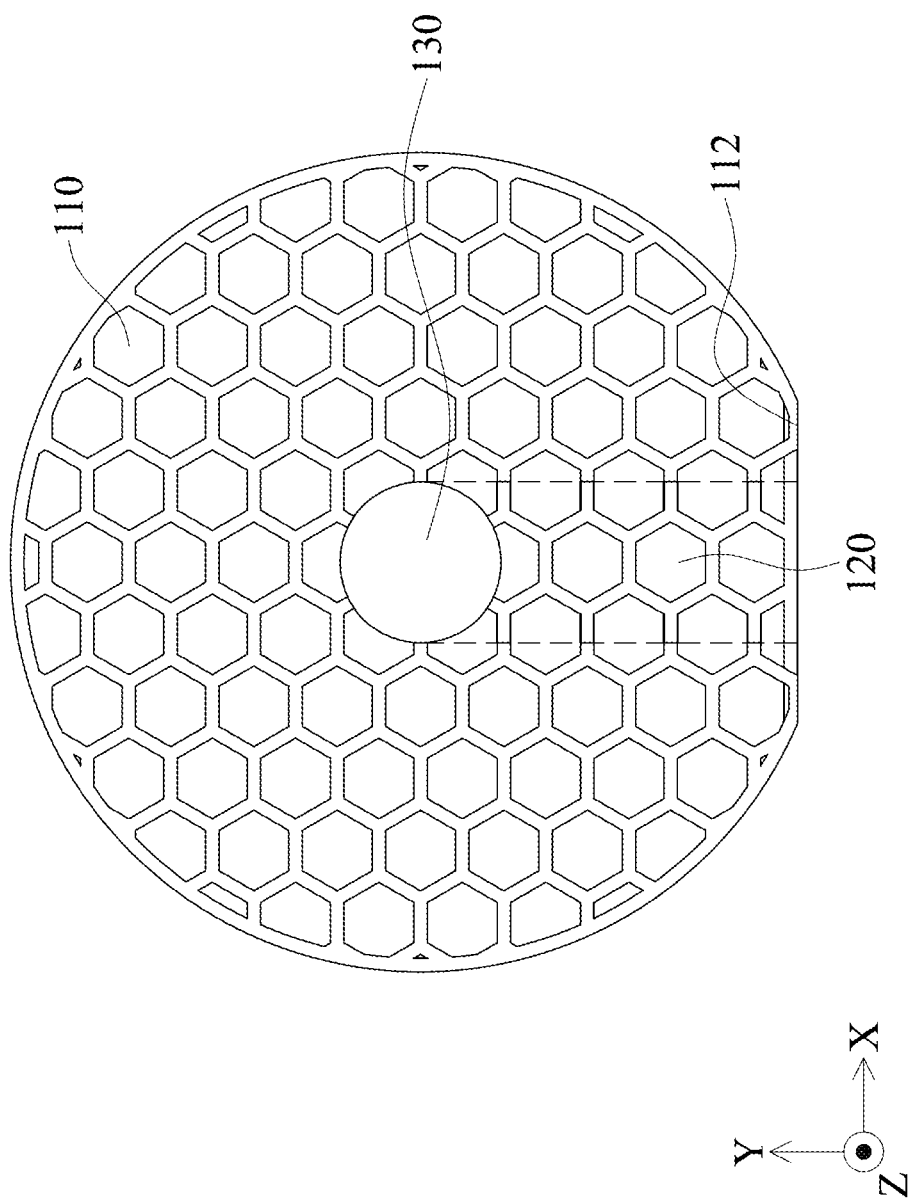
FIG. 3 is a bottom view of a drying block structure in some embodiments of the present disclosure.
Figure 4:
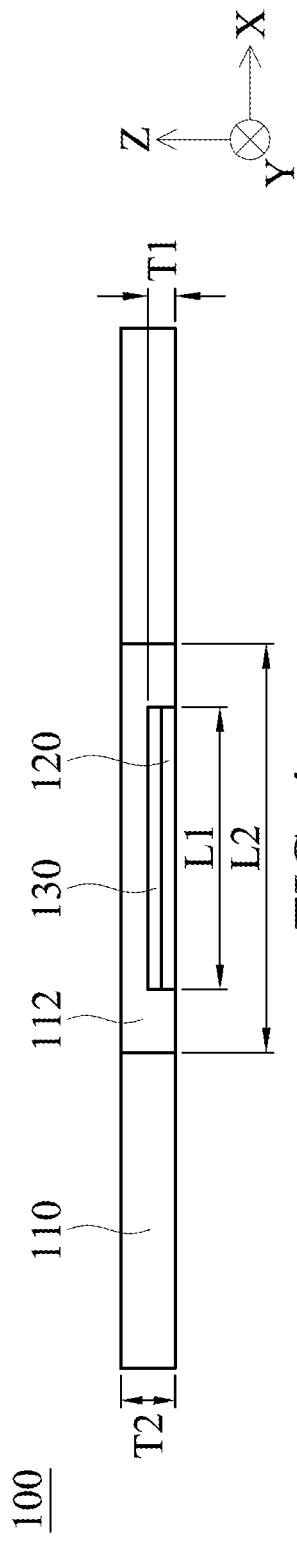
FIG. 4 is a front view of a drying block structure in some embodiments of the present disclosure.
Figure 5:
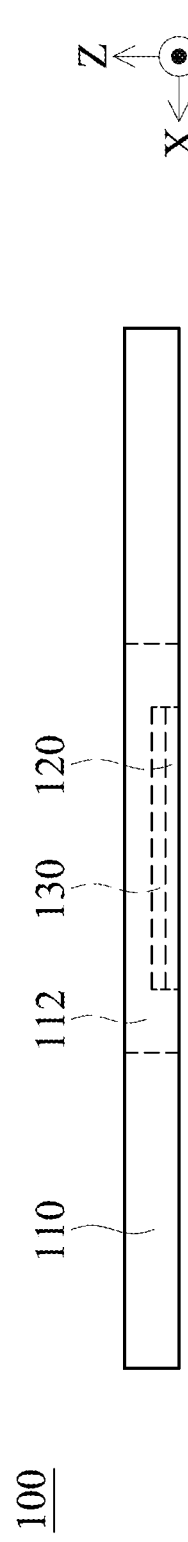
FIG. 5 is a rear view of a drying block structure in some embodiments of the present disclosure.
Figure 6:
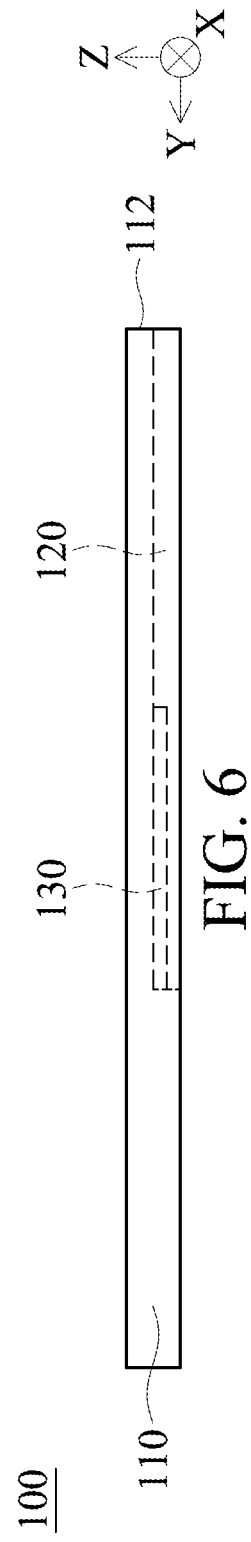
FIG. 6 is a left side view of a drying block structure in some embodiments of the present disclosure.
Figure 7:
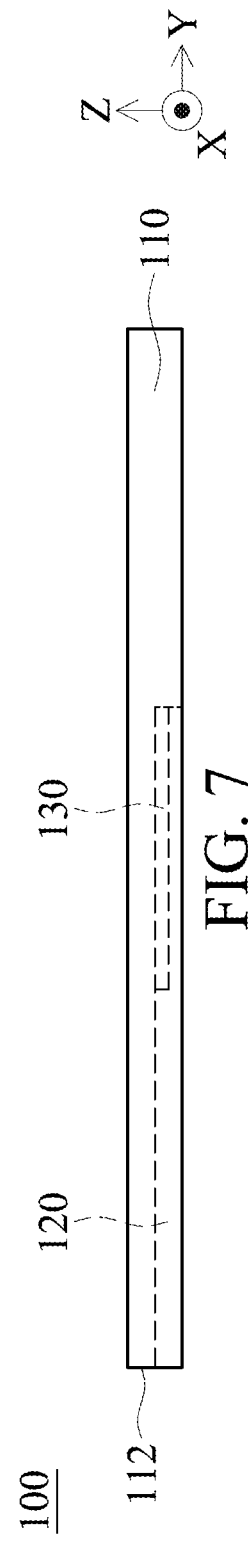
FIG. 7 is a right side view of a drying block structure in some embodiments of the present disclosure.

In FIGS. 3 and 4, the recess 120 of the drying block structure 100 extends from the center of the main body 110 to the straight side 112. It should be noted that the width L1 of the recess 120 is less than the length L2 of the straight side 112 in the extension direction of the straight side 112 (X direction). For example, in some embodiments, the diameter D of the drying block structure 100 may be 30.5 cm, the width L1 of the recess 120 may be 6 cm, and the length L2 of the straight side 112 may be 12 cm, but the present disclosure is not limited thereto. Furthermore, because the recess 120 extends from the center of the main body 110 to the straight side 112, the length of the recess 120 may be shorter than the radius of the main body 110.

In some embodiments, the depth T1 of the recess 120 is less than the thickness T2 of the main body in a normal direction of the drying block structure 100 (Z direction). For example, in some embodiments, the depth T1 of the recess 120 may be about 50% of the thickness T2 of the main body 110. In some embodiments, the thickness of the main body 110 may be 3 mm, and the depth of the recess 120 may be 1.5 mm, but the present disclosure is not limited thereto.

By designing a straight side 112 on the main body 110, the position of the drying block structure 100 may be detected by suitable sensors, and the determination result may be improved. For example, the signal intensity detected by the sensor may be increased by the straight side 112. Moreover, the drying block structure 100 may be picked up by a robot arm by designing a recess on the main body 110 to achieve automation.

Figure 8:
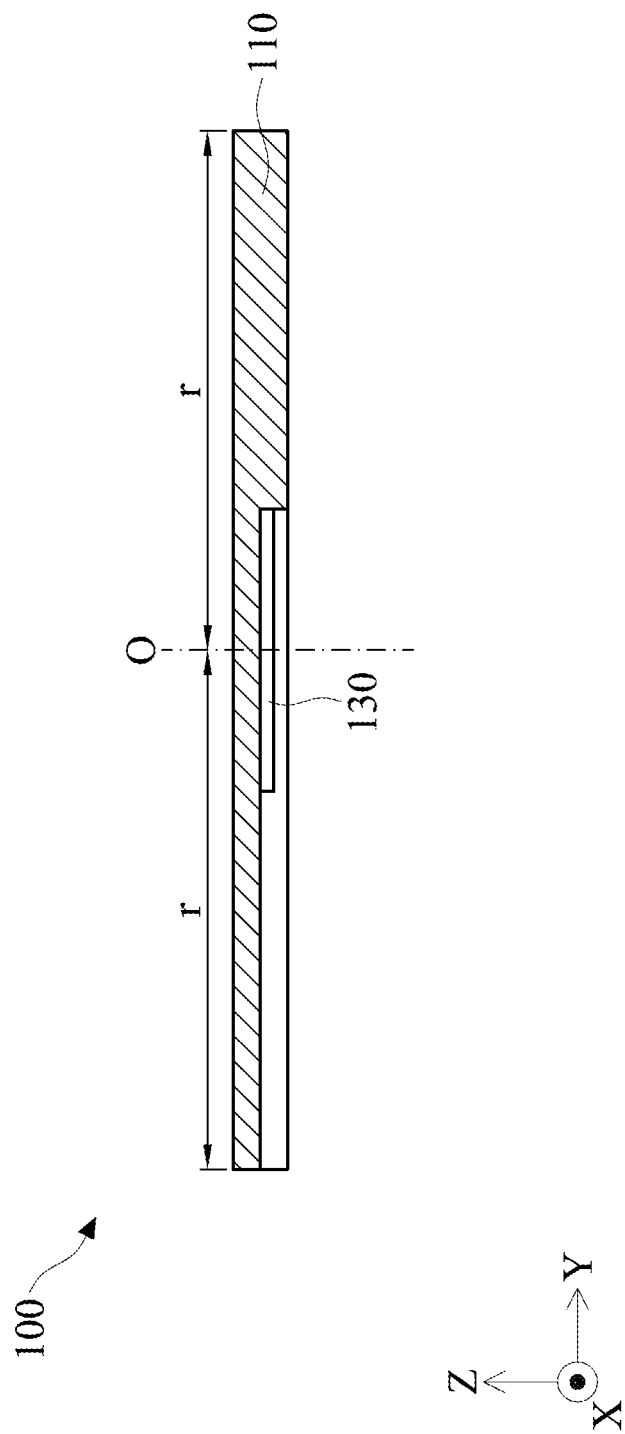
FIG. 8 is a cross-sectional view of a drying block structure in some embodiments of the present disclosure.
Figure 13:
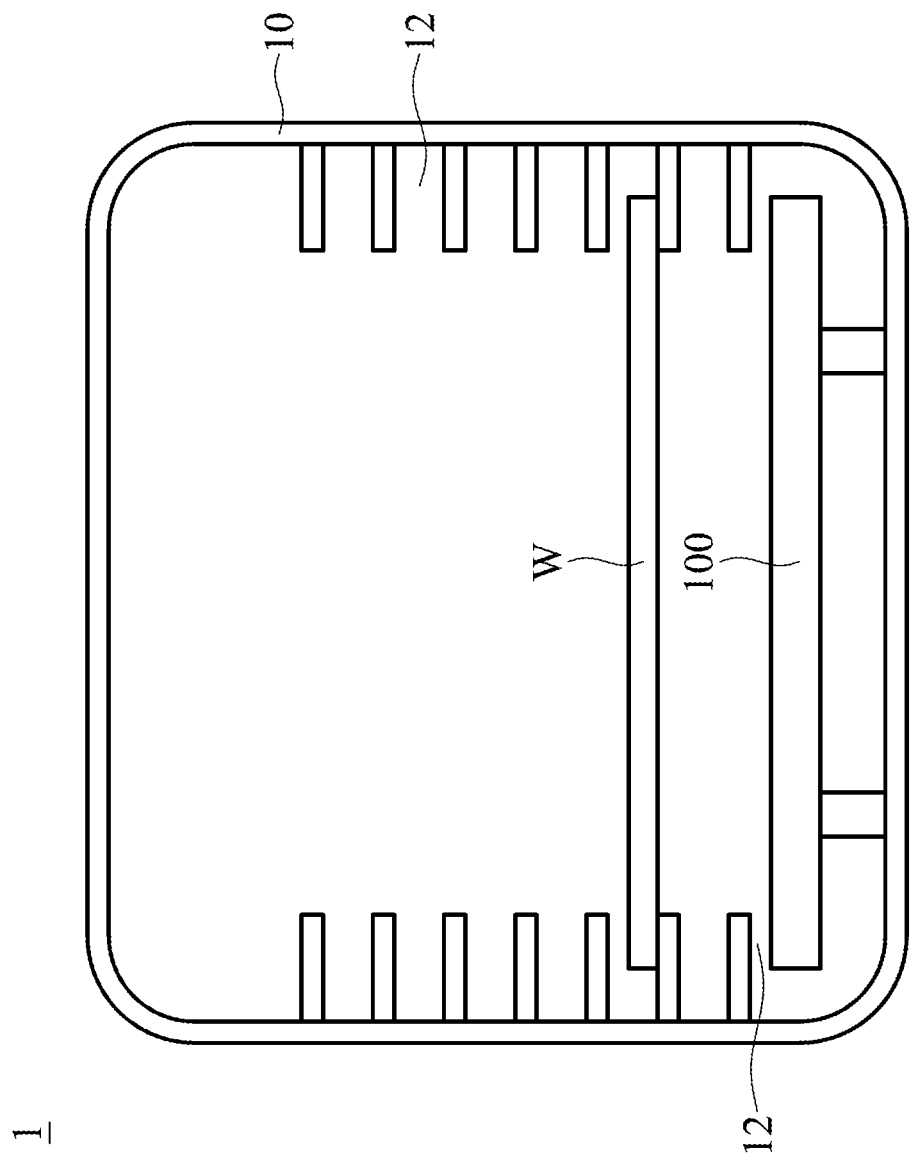
FIG. 13 is a schematic view of a storage device in some embodiments of the present disclosure.

Please refer to FIG. 8. In some embodiments, the plate-shaped element 130 may be disposed at the center of the main body 110, as shown by the center axis O and the radius r of the main body 110. In some embodiments, the material of the plate-shaped element 130 may be identical to that of the wafer W (FIG. 13). For example, the plate-shaped element 130 may include a semiconductor element (e.g. silicon). In some embodiments, the plate-shaped element 130 may be circular, and the diameter may be about 6 cm. However, the present disclosure is not limited thereto. For example, the plate-shaped element 130 may include other shapes, such as having an identical shape as the recess 120, to increase the contact area with the robot arm in some embodiments.

A position for applying force to the drying block structure 100 may be provided for the robot arm to pick up the drying block structure 100 (such as picking up the drying block structure 100 by vacuum to draw the plate-shaped element 130) by providing the plate-shaped element 130 in the recess 120. Moreover, material contamination of the wafer W (caused by the dust that is generated when the plate-shaped element 130 is used) may be avoided by the plate-shaped element 130 and the wafer W (FIG. 13) having an identical element.

Figure 10:
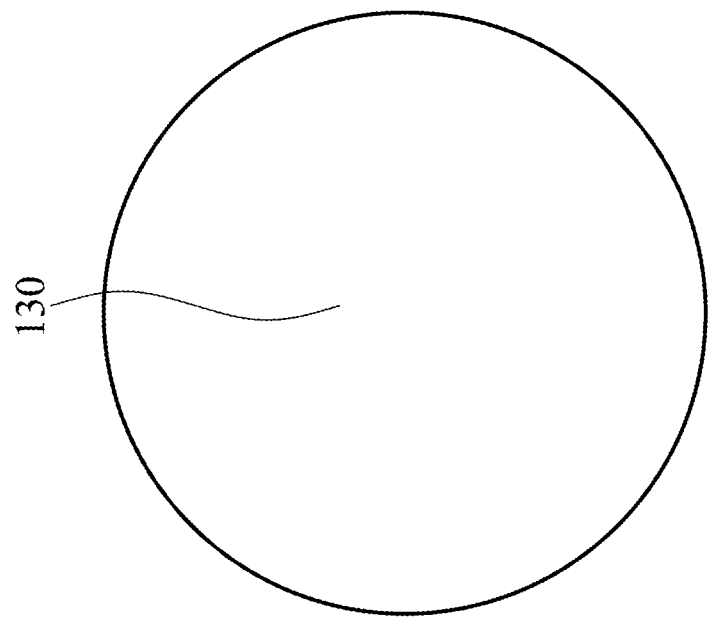
FIG. 10 is a bottom view of a plate-shaped element in some embodiments of the present disclosure.
Figure 9:
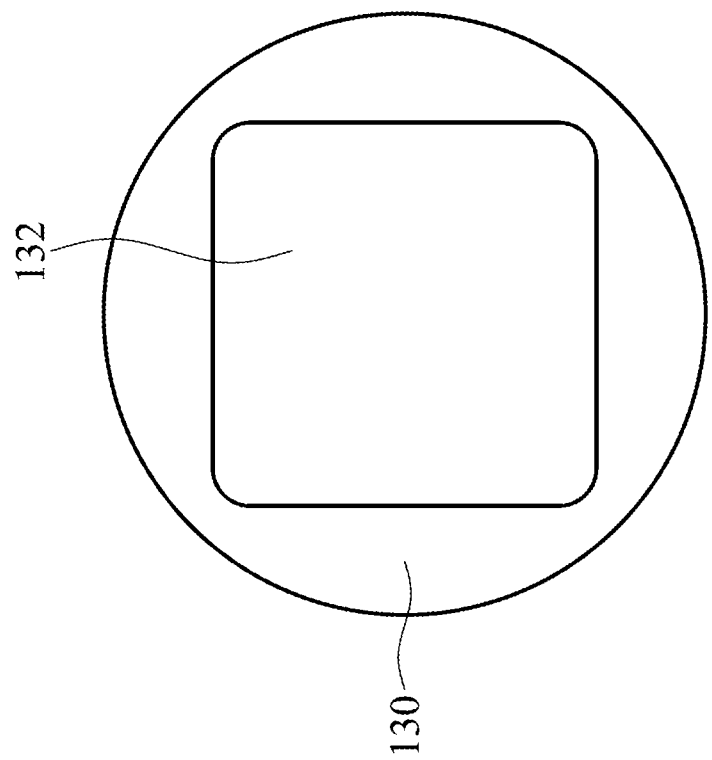
FIG. 9 is a top view of a plate-shaped element in some embodiments of the present disclosure.

Refer to FIGS. 9 and 10. A positioning element 132 may be provided on the plate-shaped element 130. The positioning element 132 may include, for example, a Radio Frequency Identification (RFID) circuit to allow the external sensor to detect the positioning element 132. As a result, the position of the drying block structure 100 may be determined through the positioning element 132 even if the drying block structure 100 is positioned in an opaque package, so automatic operation may be achieved.

In some embodiments, the positioning element 132 may be provided on the front (the Z direction) of the plate-shaped element 130, and no positioning element 132 is provided on the back (the −Z direction) of the plate-shaped element 130, as shown in FIGS. 9 and 10. This ensures that the back of the plate-shaped element 130 is a flat surface, allowing a robot arm to adhere to the back of the plate-shaped element 130 by a vacuum, and the plate-shaped element 130 may be affixed to the robot arm to allow the robot arm to more easily take the plate-shaped element 130.

Figure 11:
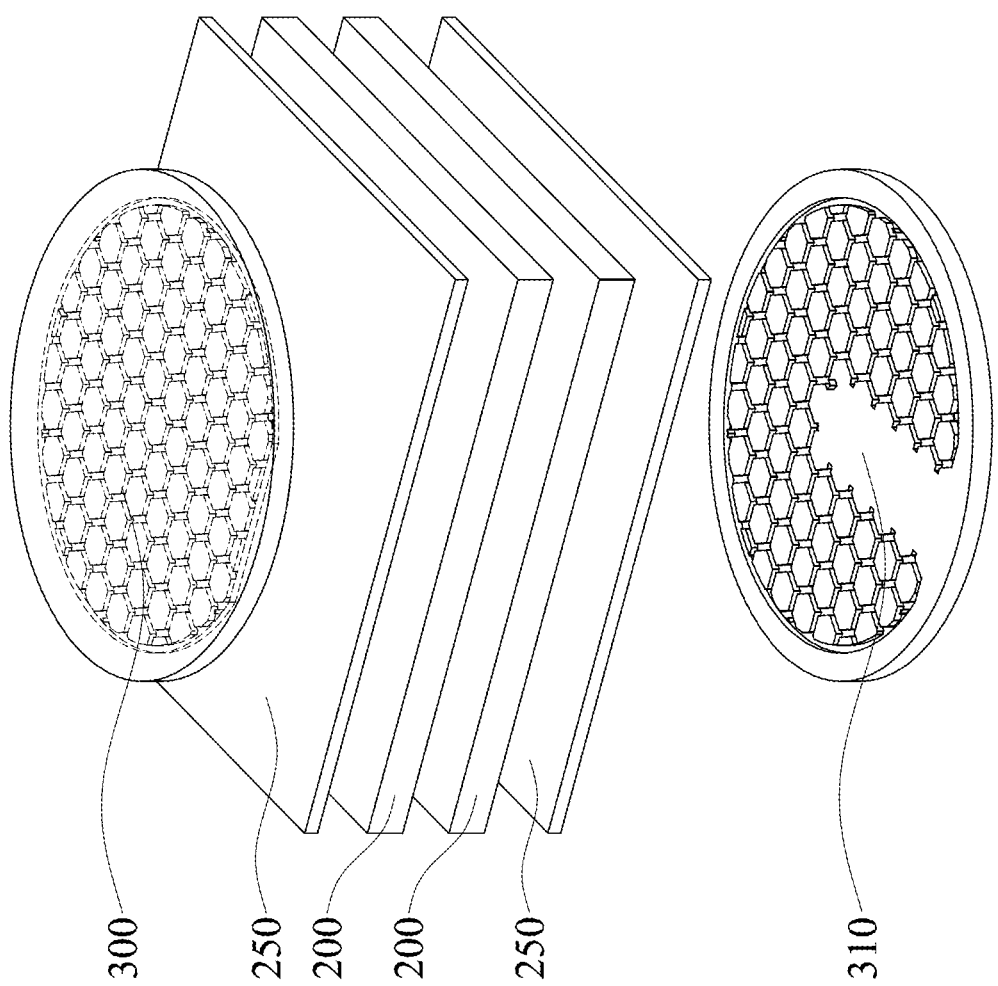
FIG. 11 is a schematic view of a manufacturing method of a drying block structure in some embodiments of the present disclosure.

Refer to FIG. 11. The drying block structure 100 may be formed by pressing porous materials 200 and protective layers 250 by an upper mold 300 and a lower mold 310. The upper mold 300 and the lower mold 310 may have corresponding shapes, such as honeycomb shapes. In some embodiments, the porous material 200 may include silicone, and the protective layer 250 may include polymer fibers (such as polyethylene), but the present disclosure is not limited thereto. In some embodiments, the porous material 200 and the protective layer 250 may be porous materials. In some embodiments, the porous material 200 and the protective layer 250 may be may be heated when the porous material 200 and the protective layer 250 are pressed with each other to further improve the pressing of the porous material 200 and the protective layer 250, such as being heated in a temperature less than 120° C. In some embodiments, the material of the protective layer 250 may have characteristics of high tear resistance, high moisture penetration, abrasion resistance, antistatic, or high stability, to avoid the drying block structure 100 from affecting the wafer W in the storage device 1 (FIG. 13).

Figure 12:
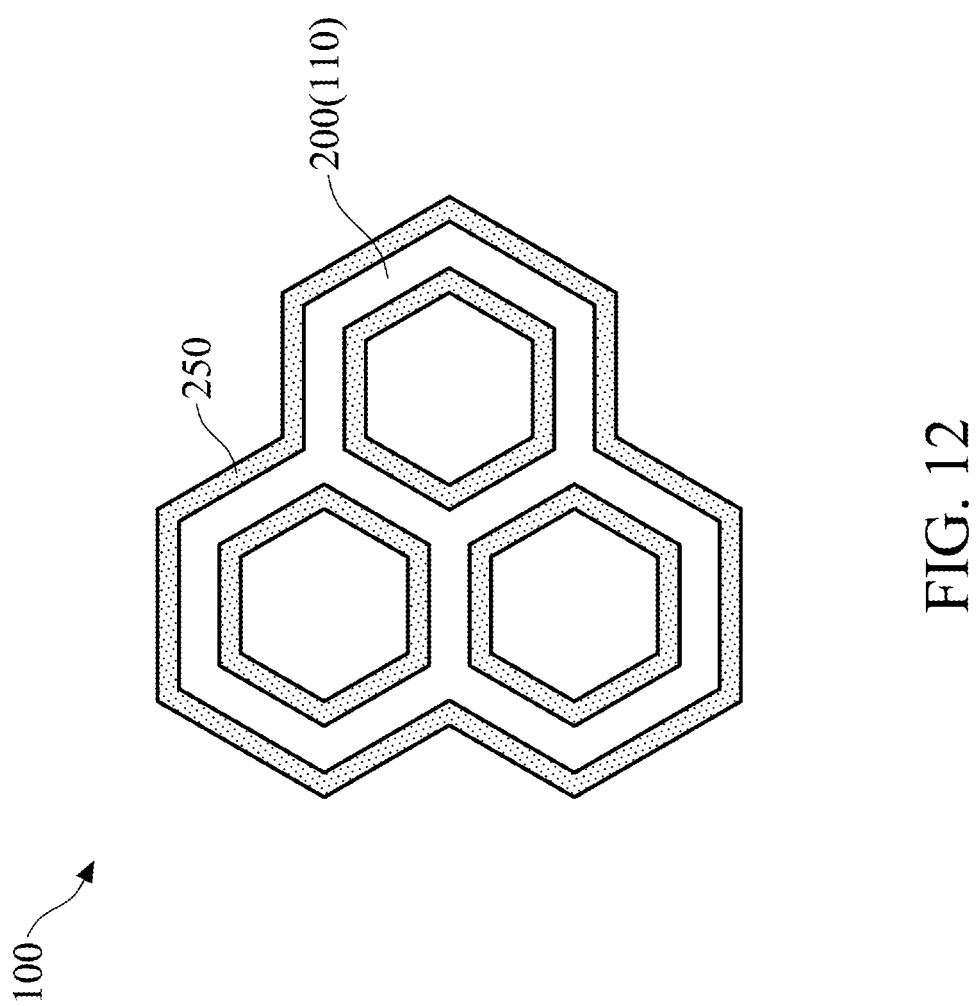
FIG. 12 is a schematic view of a drying block structure in some embodiments of the present disclosure.

Refer to FIG. 12. The protective layer 250 may cover the porous material 200 and be formed integrally with the porous material 200 after the porous material 200 and the protective layer 250 are taken out from the molds. The porous material 200 after molding may act as the main body 110 and may have a honeycomb structure. As a result, the surface area of the main body 110 may be increased to increase the reaction rate and rate of adsorption, and the structural strength of the main body 110 may be increased through the honeycomb structure. Moreover, by forming the protective layer 250 and the porous material 200 integrally, the chances of dust being generated from friction between the porous material 200 and the protective layer 250 may be reduced, to prevent pollution.

Because the porous material 200 is porous, the area for adsorption may be increased to enhance moisture adsorption. Furthermore, the protective layer 250 covering the main body 110 may prevent dust (which can be generated by the porous material 200 during use) from falling out of the drying block structure 100. Such dust may affect subsequent processes, influencing the yield. Moreover, the protective layer 250 may increase the friction of the drying block structure 100, thereby preventing the drying block structure 100 from sliding in subsequent processes. Such sliding may cause collisions with other elements and create dust.

In some embodiments, after moisture in the storage device 1 is adsorbed by the drying block structure 100, the drying block structure 100 may be heated (at a temperature of about 80° C. to about 90° C.) to remove the adsorbed moisture and reactivate the drying block structure 100. As a result, the drying block structure 100 may be reused. This helps to reduce costs and protect the environment.

Refer to FIG. 13. The storage device 1 includes a case 10, and a plurality of recesses 12 are positioned in the case 10, and a wafer W may be disposed in the recess 12. Furthermore, the drying block structure 100 may be disposed in the storage device 1. In some embodiments, the storage device 1 may be a FOSB, and the diameter of the drying block structure 100 may be designed to be substantially identical to the diameter of the wafer W to allow the drying block structure 100 to be disposed in one of the recesses 12 at the bottom of the storage device 1 without changing the structure of the storage device 1. In some embodiments, a latch (not shown) may be provided in the storage device 1 to further fix the position of the drying block structure 100.

In general, no element is disposed at the bottom of the FOSB, so the amount that the wafer W can be stored in the storage device 1 would not be affected when the drying block structure 100 is disposed at the bottom of the storage device 1. Furthermore, the relative humidity at the bottom of the storage device 1 may be higher than the relative humidity at the top of the storage device 1. As a result, positioning the drying block structure 100 at the bottom of the storage device 1 may further enhance the moisture adsorption of the drying block structure 100.

Figure 14:
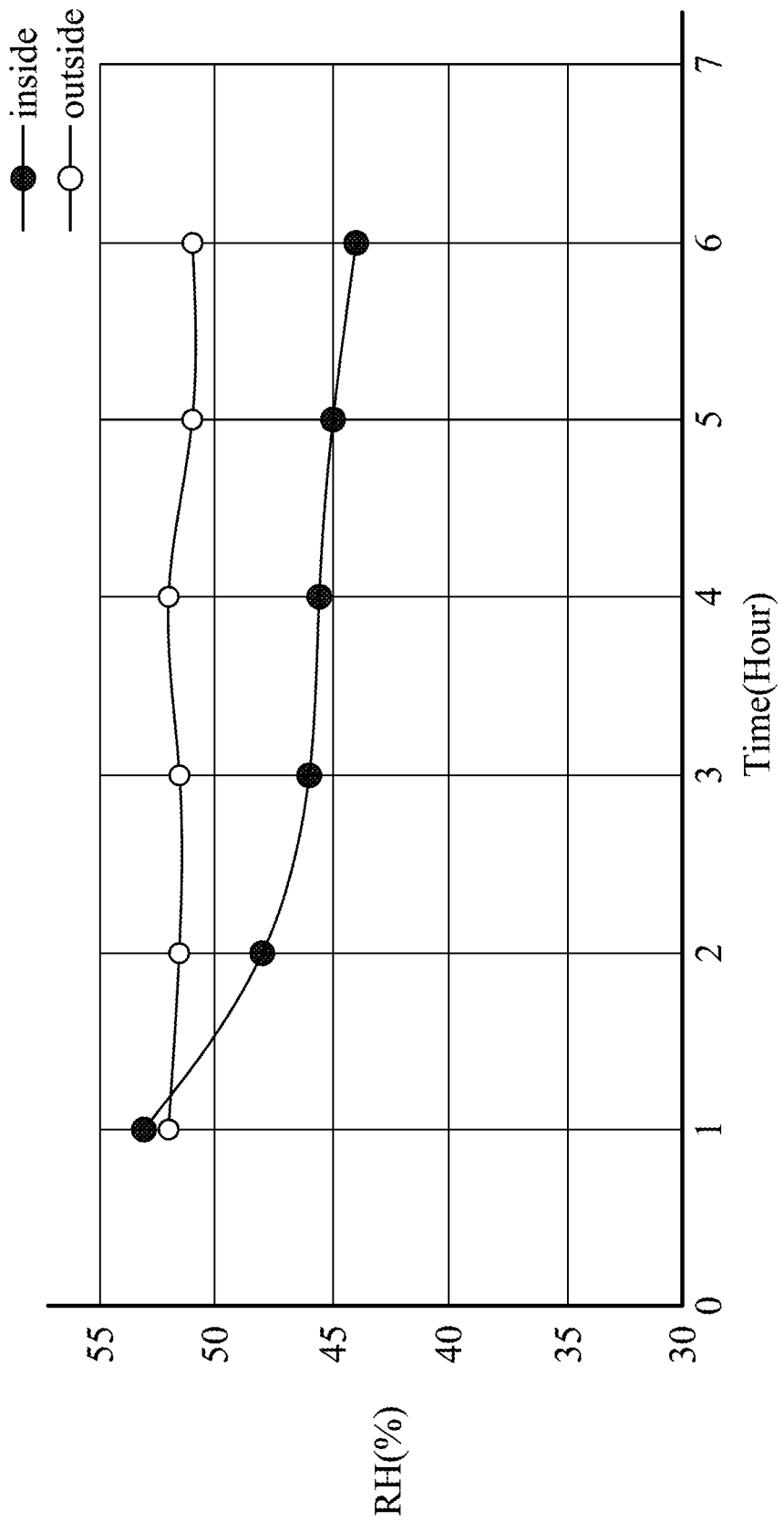
FIG. 14 shows a relationship between the relative humidity to time in the storage device when the drying block structure is positioned at different positions.

Moreover, the reaction path required for moisture adsorption may be reduced by providing the drying block structure 100 inside the storage device 1 rather than outside the storage device 1, so the moisture adsorption of the drying block structure 100 may be enhanced. For example, referring to FIG. 14, the relative humidity (RH) in the storage device 1 may substantially be a constant after positioning the drying block structure 100 outside the storage device 1 for one hour.

However, if the drying block structure 100 is disposed in the storage device 1, the relative humidity in the storage device 1 may be decreased further when compared with positioning the drying block structure 100 outside the storage device 1, and the moisture adsorption time may be extended. In some embodiments, positioning the drying block structure 100 in the storage device 1 may keep the relative humidity in the storage device 1 under 25%. As a result, chemical reactions catalyzed by moisture may be suppressed, and thereby the chance of corrosion on the contacts on the wafer may be decreased to improve the product yield.

In summary, a drying block structure is provided. The drying block structure may be directly positioned in current storage device without change the structure of the storage device by designing the drying block structure to have a similar shape to current wafer. Furthermore, problems of using a robot arm for picking may be solved by the drying block structure provided in the present disclosure, and it may be easier for the sensor to detect the position of the drying block structure, which is beneficial for automatic operations.

What is claimed is:

1. A drying block structure, comprising:
   a main body having a honeycomb structure and holes in the honeycomb structure, the main body being substantially circular in shape, wherein the main body has a recess extending from a center of the main body to a straight side in a first direction;
   a plate-shaped element fitted in the recess, wherein a thickness of the plate-shaped element is less than a depth of the recess, the plate-shaped element is exposed from the recess when viewed from the straight side to the center of the main body, and the plate-shaped element is partially covered by the honeycomb structure of the main body and partially exposed from the holes in the honeycomb structure when viewed in a second direction perpendicular to the first direction and the straight side;
   a protective layer covering the main body and having a porous structure, wherein the protective layer is formed integrally with the main body and in the recess; and
   a positioning element disposed on the plate-shaped element, wherein the positioning element comprises a Radio Frequency Identification (RFID) circuit disposed on a surface facing the main body,
   wherein a surface of the plate-shaped element facing away from the main body is a flat surface.

2. The drying block structure as claimed in claim 1, wherein the main body comprises the straight side and an arc-shaped side.

3. The drying block structure as claimed in claim 1, wherein a width of the recess is less than a length of the straight side in an extension direction of the straight side.

4. The drying block structure as claimed in claim 1, wherein the depth of the recess is less than a thickness of the main body in a direction perpendicular to an extension direction of the straight side.

5. The drying block structure as claimed in claim 1, wherein the material of the main body comprises porous material, and the material of the plate-shaped element comprises semiconductor material.

6. The drying block structure as claimed in claim 1, wherein a length of the recess is shorter than a radius of the main body.

7. The drying block structure as claimed in claim 1, wherein a greatest dimension of the plate-shaped element is identical to a width of the recess.

8. A storage device for storing a wafer, comprising:
   a case, wherein a plurality of recesses are positioned in the case, and the wafer is disposed in one of the recesses; and
   a drying block structure, comprising:
   a main body having a honeycomb structure and holes in the honeycomb structure, the main body being substantially circular in shape, wherein the main body has a recess extending from a center of the main body to a straight side in a first direction;
   a plate-shaped element fitted in the recess, wherein a thickness of the plate-shaped element is less than a depth of the recess, the plate-shaped element is exposed from the recess when viewed from the straight side to the center of the main body, and the plate-shaped element is partially covered by the honeycomb structure of the main body and partially exposed from the holes in the honeycomb structure when viewed in a second direction perpendicular to the first direction and the straight side;
   a protective layer covering the main body and having a porous structure, wherein the protective layer is formed integrally with the main body; and
   a positioning element disposed on the plate-shaped element, wherein the positioning element comprises a Radio Frequency Identification (RFID) circuit disposed on a surface facing the main body,
   wherein the drying block structure is disposed in another one of the recesses, and a diameter of the drying block structure is substantially identical to a diameter of the wafer, and
   wherein a surface of the plate-shaped element facing away from the main body is a flat surface.

9. The storage device as claimed in claim 8, wherein the main body comprises the straight side and an arc-shaped side.

10. The storage device as claimed in claim 8, wherein a width of the recess is less than a length of the straight side in an extension direction of the straight side.

11. The storage device as claimed in claim 8, wherein the depth of the recess is less than a thickness of the main body in the direction perpendicular to an extension direction of the straight side.

12. The storage device as claimed in claim 8, wherein a material of the main body comprises porous material, and a material of the plate-shaped element comprises semiconductor material.

13. The storage device as claimed in claim 8, wherein a length of the recess is shorter than a radius of the main body.

* * * * *